United States Patent [19]

Kawashima

[11] Patent Number: 4,633,124
[45] Date of Patent: Dec. 30, 1986

[54] MOUNT FOR QUARTZ CRYSTAL RESONATOR

[75] Inventor: Hirofumi Kawashima, Tokyo, Japan

[73] Assignee: Kabushiki Kaisha Daini Seikosha, Tokyo, Japan

[21] Appl. No.: 475,446

[22] Filed: Mar. 15, 1983

[30] Foreign Application Priority Data

Mar. 16, 1982 [JP] Japan .................................. 57-41158
Mar. 16, 1982 [JP] Japan .................................. 57-41159

[51] Int. Cl.⁴ .......................................... H01L 41/08
[52] U.S. Cl. .................................. 310/348; 310/361; 310/346; 310/351
[58] Field of Search ............. 310/360, 361, 351–353, 310/348, 346, 370

[56] References Cited

U.S. PATENT DOCUMENTS

| | | | |
|---|---|---|---|
| 2,272,994 | 2/1942 | Mason | 310/361 |
| 2,274,079 | 2/1942 | Mason | 310/361 |
| 3,257,704 | 6/1966 | Hafner et al. | 310/351 X |
| 3,656,217 | 4/1972 | Scott, Jr. et al. | 310/348 X |
| 3,906,260 | 9/1975 | Oguchi | 310/346 |
| 4,234,811 | 11/1980 | Hishida et al. | 310/348 |
| 4,350,918 | 9/1982 | Sato | 310/361 X |
| 4,410,827 | 10/1983 | Kogure | 310/370 |
| 4,443,728 | 4/1984 | Kudo | 310/348 |

FOREIGN PATENT DOCUMENTS

| | | | |
|---|---|---|---|
| 52-61988 | 5/1977 | Japan | 310/348 |
| 0077692 | 6/1977 | Japan | 310/348 |
| 0072492 | 6/1978 | Japan | 310/348 |
| 0003486 | 1/1979 | Japan | 310/348 |
| 0049012 | 4/1980 | Japan | 310/346 |
| 0068716 | 5/1980 | Japan | 310/348 |
| 0085120 | 6/1980 | Japan | 310/361 |
| 0093313 | 7/1980 | Japan | 310/348 |

Primary Examiner—Mark O. Budd
Attorney, Agent, or Firm—Robert E. Burns; Emmanuel J. Lobato; Bruce L. Adams

[57] ABSTRACT

A mounting is provided for a GT-cut, coupled mode piezoelectric resonator. The mount includes pedestals with recesses. Portions of the resonator are mounted in the recesses.

17 Claims, 64 Drawing Figures

FIG.1(A)
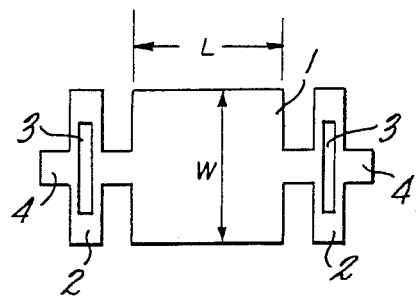
FIG.1(B)
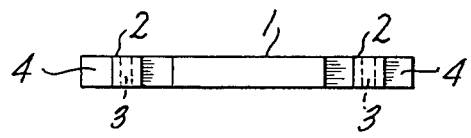
FIG.2(A)
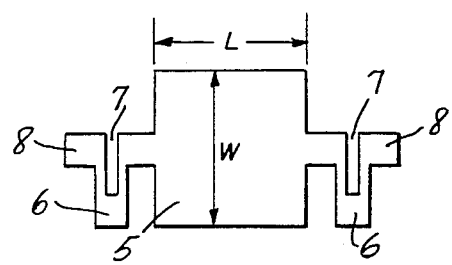
FIG.2(B)
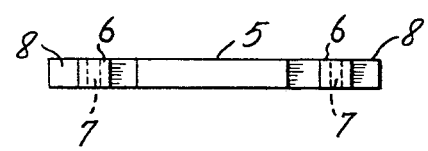
FIG.3(A)
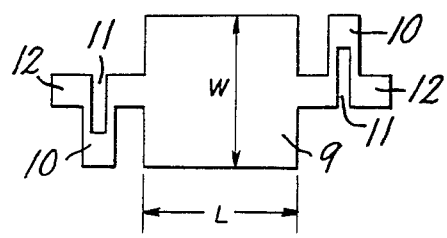
FIG.3(B)
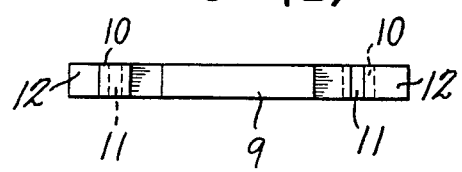
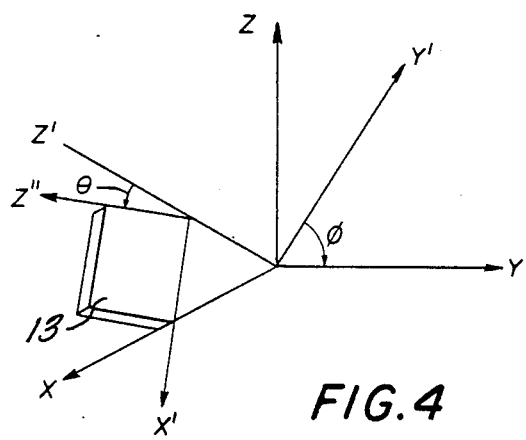
FIG.4

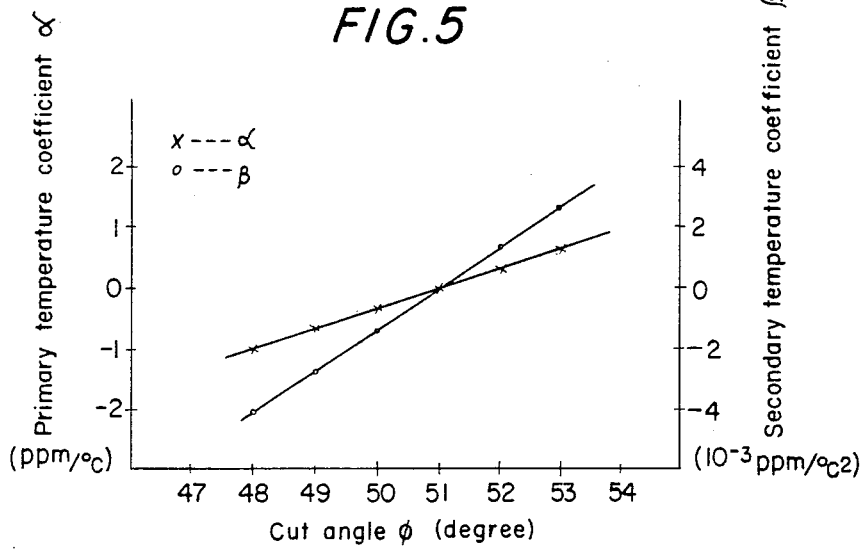
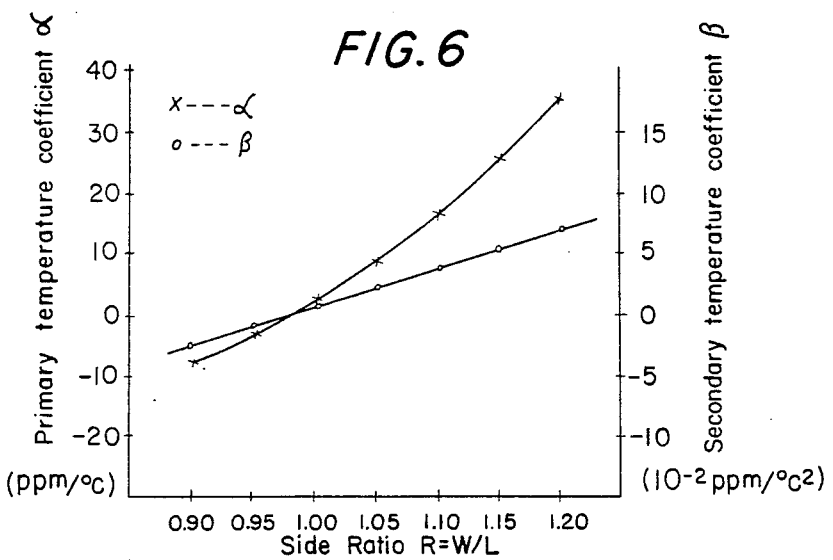
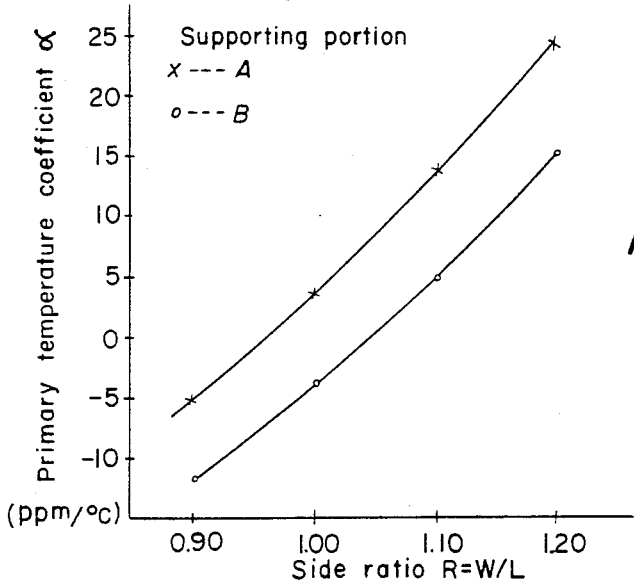

$\bar{X} = 140 (\Omega)$
$n = 200$ $\bar{X} = 84 (\Omega)$
$n = 200$

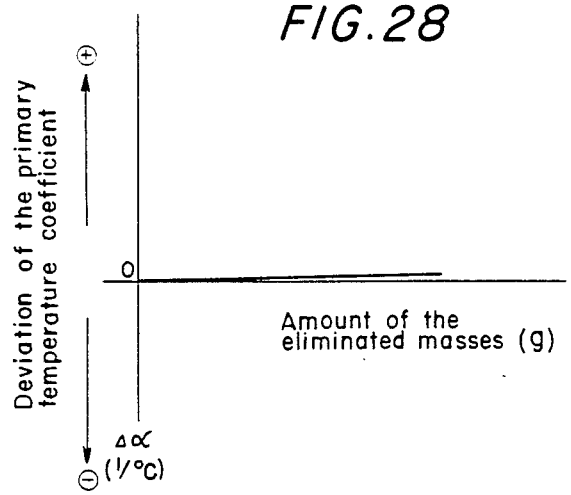
FIG.28
FIG.29
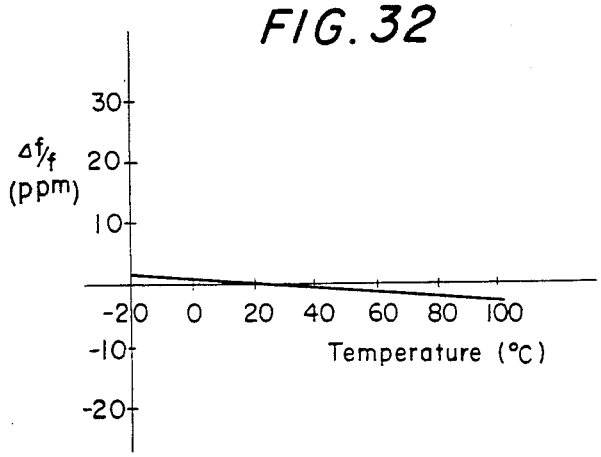
FIG.32
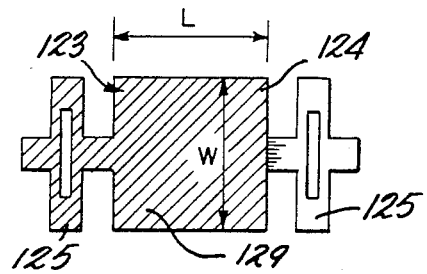
FIG.33(A)
FIG.33(B)
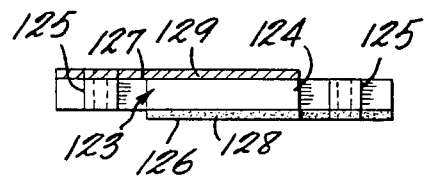
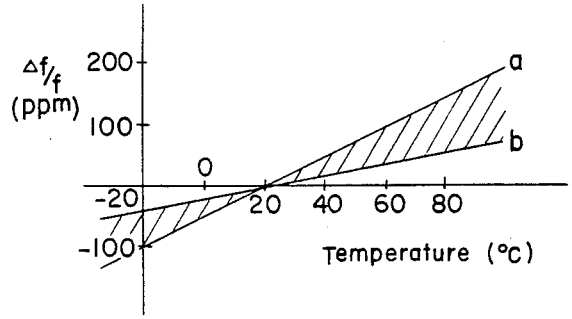
FIG.34
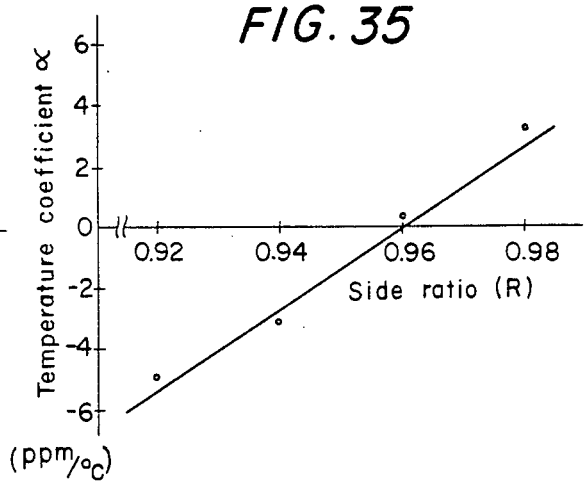
FIG.35

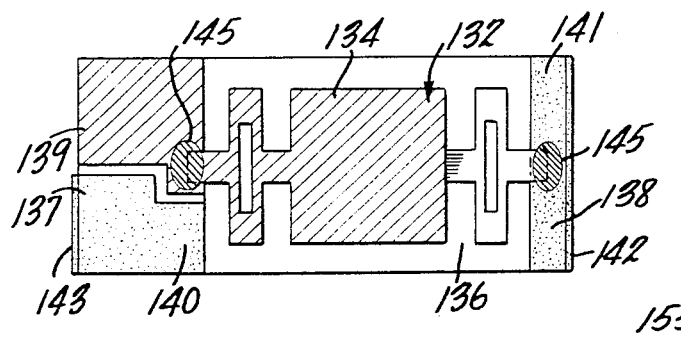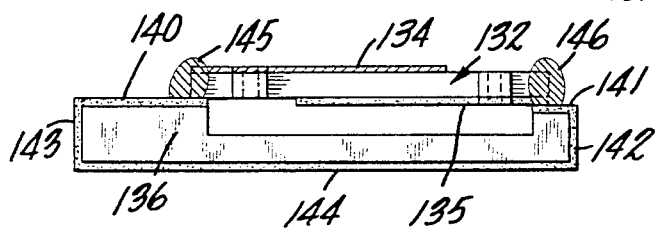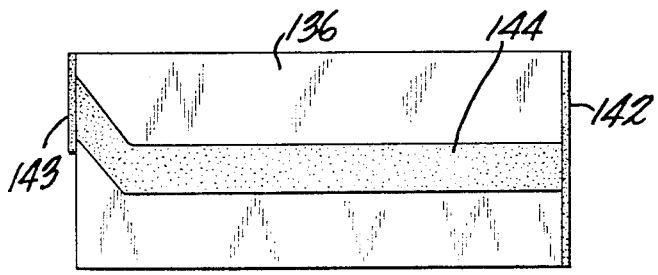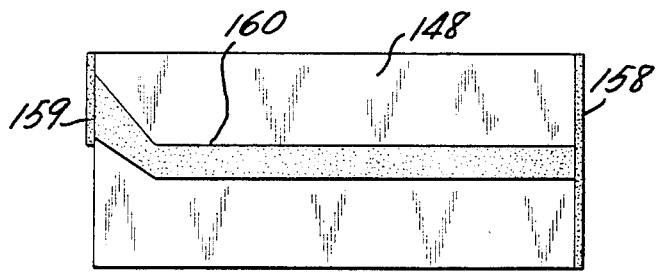

MOUNT FOR QUARTZ CRYSTAL RESONATOR

BACKGROUND OF THE INVENTION

The present invention relates generally to a coupling quartz crystal resonator, and particularly to a GT-cut quartz crystal resonator in which plural longitudinal coupling modes are coupled and to a method for manufacturing the same.

Conventionally, an AT-cut quartz crystal resonator has been used for consumer products which require a resonator with excellent temperature characteristics and small CI (crystal impedance). Lately, in accordance with the miniaturization of various consumer products, miniaturization of the AT-cut quartz resonator has also been required. Miniaturization of this type resonator, however, is difficult because of the frequent occurrence of spurious vibrations and the resultant high CI. Unlike a tuning fork flexural quartz crystal resonator, it is difficult to minimize the size of the AT-cut quartz crystal resonator for use in a watch. Accordingly, a method of forming a resonator by photography which applies an IC technique has recently been applied to the manufacture, for example, of a tuning fork quartz crystal resonator and a GT-cut quartz crystal resonator (U.S. Pat. No. 4,350,918), and resultantly an extremely miniature resonator can be provided. However, U.S. Pat. No. 4,350,918 does not teach the electrode arrangement, a method for adjusting the frequency, a method for adjusting the temperature coefficient or the specific shape of the pedestal. On the contrary, the present invention discloses the above features.

Since, however, the GT-cut quartz resonator is supported at both ends, unlike the conventional type, it is necessary to improve the method for manufacturing the resonator unit. Accordingly, the present invention also provides a method for manufacturing a quartz crystal resonator unit having excellent shock resistance and frequency-temperature characteristics.

SUMMARY OF THE INVENTION

Accordingly, it is an object of the invention to provide a coupling quartz crystal resonator, particularly a GT-cut quartz crystal resonator having excellent frequency-temperature characteristics (referred to as temperature characteristic hereafter).

It is another object of the invention to provide a GT-cut quartz crystal resonator having a small CI (Crystal Impedance).

It is another object of the invention to provide a GT-cut quartz crystal resonator which possesses excellent shock resistance.

It is another object of the invention to provide a resonator supporting structure to enable mounting of the resonator in a simple mounting operation.

BRIEF EXPLANATION OF THE DRAWINGS

FIGS. 1(A) and 1(B) show an embodiment of the shape of the coupling resonator according to the present invention, FIG. 1(A) shows a plan view and FIG. 1(B) shows a side view, FIGS. 2(A) and 2(B) show another embodiment of the shape of the coupling resonator according to the present invention, FIG. 2(A) shows a plan view and FIG. 2(B) show a side view, FIGS. 3(A) and 3(B) show another embodiment of the shape of the coupling resonator according to the present invention, FIG. 3(A) shows a plan view and FIG. 3(B) shows a side view, FIG. 4 shows the cut directions of the GI-cut quartz resonator according to the present invention, FIG. 5 shows the relationship between the cut angle $\phi$ and the temperature coefficients $\alpha$, $\beta$ of the coupling quartz crystal resonator according to the present invention, FIG. 6 shows the relationship between the side ratio R and the temperature coefficients $\alpha$, $\beta$ of the GT-cut quartz crystal resonator according to the present invention, FIG. 7 shows the relationship between the side ratio R and the temperature coefficient $\alpha$ when the dimensions of the supporting portions of the GT-cut quartz crystal resonator are used as parameter, FIG. 8(A) shows a plan view and FIG. 8(B) shows a side view, FIG. 9(A) shows a plan view and FIG. 9(B) shows a side view, FIG. 28 shows another relationship between the amount of the eliminated masses and the deviation $\Delta\alpha$ of the primary temperature coefficient $\alpha$, FIG. 29 shows the relationship between the amount of the eliminated masses and the variation of the resonance frequency of the main vibration, FIG. 30(A) shows a top plan view, FIG. 30(B) shows a lower side view of FIG. 30(A) and FIG. 30(C) shows a bottom view of FIG. 30(B), FIGS. 31(A), 31(B) and 31(C) show another embodiment of the GT-cut quartz resonator mounted on a pedestal according to the present invention, FIG. 32 is a graph showing the temperature characteristic according to the present invention, FIGS. 33(A) and 33(B) show an embodiment of the shape and electrode arrangement of the GT-cut coupling resonator according to the present invention, in which the resonance portion and the supporting portions are formed in one piece, FIG. 33(A) shows a plan view and FIG. 33(B) shows a side view, FIG. 34 is a graph showing the temperature characteristics of a GT-cut quartz crystal resonator formed by photolithography, FIG. 35 is a graph showing the relationship between the side ratio R and the primary temperature coefficient $\alpha$ of the GT-cut quartz crystal resonator whose resonant portion and the supporting portions are formed in one piece, FIGS. 40(A), 40(B) and 40(C) show an embodiment of the GT-cut quartz crystel resonator mounted on a pedestal according to the present invention, FIG. 40(A) is a top plan view, FIG. 40(B) is a lower side view of FIG. 40(A) and FIG. 40(C) is a bottom view of FIG. 40(B), FIGS. 41(A), 41(B) and 41(C) show another embodiment of the GT-cut quartz crystal resonator mounted on the pedestal according to the present invention, FIG. 41(A) is a top plan view, FIG. 41(B) is a lower side view of FIG. 41(A) and FIG. 41(C) is a bottom view of FIG. 41(B)

DETAILED DESCRIPTION OF THE INVENTION

Figure 8A:
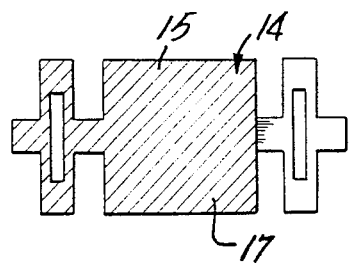
FIGS. 8(A) and 8(B) show an embodiment of electrode arrangement of the shape of the coupling resonator according to the present invention.

FIGS. 1(A) and 1(B) show one embodiment of the shape of a GT-cut coupling resonator according to the present invention, in which a resonant portion 1 is made in one piece with two supporting portions 2 at both sides of the resonant portion by etching. FIG. 1(A) is a plan view and FIG. 2(B) is a side view.

Recesses or openings 3 are provided at both the supporting portions 2 between the resonant portion 1 and mount portions 4. The recesses 3 are provided to enclose and confine the exciting energy of the resonant portion 1 so that the exciting energy of the resonant portion is not transmitted to the mount portions 4. Therefore, energy is not lost by mounting the resonator, and a resonator having a small CI value is obtained.

FIGS. 2(A) and 2(B) show another embodiment of the shape of a coupling GT-cut quartz crystal resonator according to the present invention, in which a resonator portion 5 and two supporting portions 6 at both sides of the resonant portion are made in one piece by etching. FIG. 2(A) shows a plan view and FIG. 2(B) shows a side view. Recesses or openings 7 are provided at both the supporting portions 6 between the resonant portion 5 and mount portions 8. The recesses 7 are provided for the same reason as that explained above with reference to FIGS. 1(A) and 1(B).

FIGS. 3(A) and 3(B) show another embodiment of the shape of a coupling GT-cut quartz crystal resonator according to the present invention, in which a resonant portion 9 and two supporting portions 10 at both sides of the resonant portion are formed in one piece by etching.

FIG. 3(A) shows a plan view and FIG. 3(B) shows a side view. Recesses 11 are provided at both the supporting portion 10 between the resonant portion 9 and mount portions 12. The recesses 11 are provided for the same reason as explained with reference to FIGS. 1(A) and 1(B).

In the resonators shown in FIGS. 1(A), 1(B), 2(A), 2(B), 3(A) and 3(B), the resonance freqencies of two modes are determined by the width W and the length L dimensions.

When the resonance frequency of the main vibration determined by the width W is fW and the resonance frequency of the spurious vibration determined by the length L is fL, the temperature characteristic is substantially determined by the balance of both resonance frequencies; $\Delta f = fW - fL$. Namely, the temperature characteristics is determined by the side ratio $R = W/L$.

FIG. 4 shows the cut directions, i.e. formation directions by etching of the GT-cut quartz crystal resonator according to the present invention. X axis, Y axis and Z axis are respectively the electrical axis, mechanical axis and optical axis of a quartz crystal. A quartz crystal resonator 13 is formed to become YXlt ($\phi/\theta$) by the IRE standard. X' axis, Y' axis and Z' axis are respectively the new axes after turning the X, Y and Z axes.

FIG. 5 shows the relationship between the cut angle $\phi$ of the GT-cut quartz crystal resonator, whose resonant portion is formed in one piece with the supporting portions by etching, and the primary and the secondary temperature coefficients $\alpha$ and $\beta$. The shape of the resonator, i.e. the side ratio R, and the cut angle $\theta$ are fixed. As understood from FIG. 5, the primary and the secondary temperature coefficients $\alpha$ and $\beta$ shift from the negative value to the positive value as the cut angle $\theta$ increases. $\alpha$ varies less than $\beta$ per 1 degree change of the cut angle. $\alpha$ and $\beta$ are almost zero when the cut angle $\theta \approx 51$, so that an excellent temperature characteristic is obtained.

FIG. 6 shows the relationship between the side ratio $R = W/L$ of the GT-cut quartz crystal resonator according to the present invention and the primary and the secondary temperature coefficients $\alpha$ and $\beta$. The cut angles $\phi$ and $\theta$ are fixed. As understood from FIG. 6, the primary and the secondary temperature coefficients $\alpha$ and $\beta$ vary from the negative value to the positive value as the side ratio R increases. $\beta$ varies less than $\alpha$ per unit change of the side ratio R. $\alpha$ and $\beta$ are almost zero when the side ratio $R \approx 0.98$, so that an excellent temperature characteristic is obtained.

FIG. 7 shows the relationship between the side ratio $R = W/L$ and the primary temperature coefficient $\alpha$ when the dimension of the supporting portions of the GT-cut quartz crystal resonator are used as a parameter. A supporting portion B is designed to suppress the spurious vibration more than the supporting portion A. The side ratio which is needed to set $\alpha$ at zero is different in the supporting portion A and the supporting portion B. The side ratio R to set $\alpha$ at zero is larger in the supporting portion B than in the supporting portion A. Therefore an excellent temperature characteristic of the GT-cut quartz crystal resonator according to the present invention is obtained by a combination of the cut angles $\phi = 48°-53°$, $\theta = (45°-55°)$ and the side ratio $R = 0.9-1.2$.

Figure 9A:
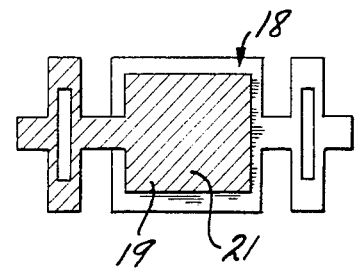
FIGS. 9(A) and 9(B) show another embodiment of electrode arrangement of the shape of the coupling resonator according to the present invention.
Figure 8B:
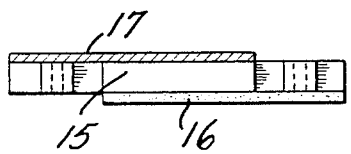
Figure 9B:
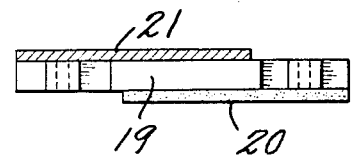

FIGS. 8(A) and 9(B) show an embodiment of electrode arrangement of the coupling resonator according to the present invention. FIG. 8(A) shows a plan view and FIG. 8(B) shows a side view. Exciting electrodes 16 and 17 are uniformly arranged on the lower and upper opposed major surfaces of a resonant portion 15 of a quartz crystal resonator 14. The exciting electrode 16 elongates to one supporting portion and the exciting electrode 17 elongates to the other supporting portion. In this case the electrodes are respectively deposited on one side of each of the supporting portions but not both sides, so that no electric field is applied to the supporting portions.

FIGS. 9(A) and 9(B) show another embodiment of electrode arrangement of the coupling resonator according to the present invention. FIG. 9(A) shows a plan view and FIG. 9(B) shows a side view. Exciting electrodes 20 and 21 are deposited on lower and upper opposed major surfaces of a resonant portion 19 of a quartz crystal resonator 18 except for the peripheral portion.

Figure 10:
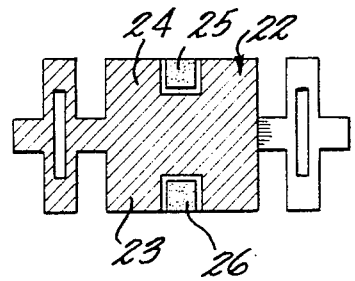
FIG. 10 shows another embodiment of electrode arrangement of the shape of the coupling resonator according to the present invention.

FIG. 10 show another embodiment of electrode arrangement of the coupling resonator according to the present invention. An exciting electrode 24 and masses 25 and 26 for frequency adjustment are deposited on a resonant portion 23 of a quartz crystal resonator 22. The exciting electrode is not electrically connected to the masses. The exciting electrode is arranged on almost the overall major surface of the resonant portion of the resonator except for the positions of the masses. Although not shown, a rear exciting electrode may be arranged on the overall rear major surface of the resonant portion or the rear electrode and masses may be deposited symmetrically to the exciting electrode 24 and the masses 25 and 26.

Figure 11:
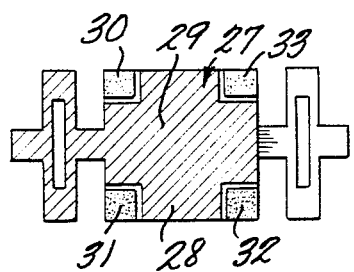
FIG. 11 shows a plan view of another embodiment of electrode arrangement of the shape of the coupling resonator according to the present invention.

FIG. 11 shows a plan view of another embodiment of the electrode arrangement of the coupling resonator according to the present invention. An exciting electrode 29 is arranged on a resonant portion 28 of a quartz crystal resonator 27 except for the positions of masses 30, 31, 32 and 33 for frequency adjustment provided at the four corners of the resonant portion.

Figure 12:
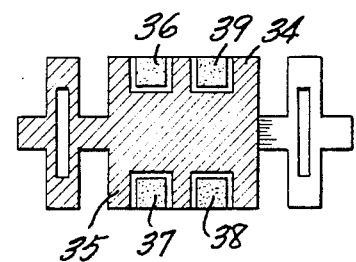
FIGS. 12-19 show plan views showing other embodiments of electrode arrangement of the shape of the coupling resonator according to the present invention.

FIG. 12 shows a plan view of another embodiment of electrode arrangement of the coupling resonator according to the present invention. An exciting electrode 35 and masses 36, 37, 38 and 39 for frequency adjustment are deposited on a resonant portion 34. The exciting electrode is arranged on the overall surface of the resonant portion except for the position of the masses.

Figure 13:
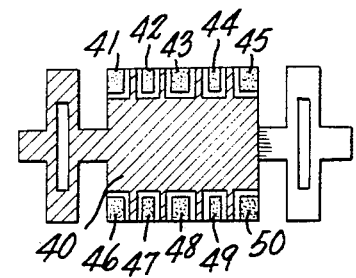

FIG. 13 is a plan view showing another embodiment of electrode arrangement of the coupling resonator according to the present invention. An exciting electrode 40 indicated by oblique lines and masses 41–50 for frequency adjustment are deposited on the resonant portion.

Figure 14:
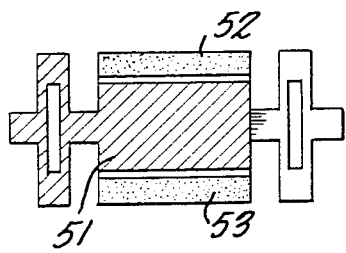

FIG. 14 shows a plan view of another embodiment of electrode arrangement of the coupling resonator according to the present invention. An exciting electrode 51 and masses 52 and 53 are deposited on the resonant portion.

Figure 19:
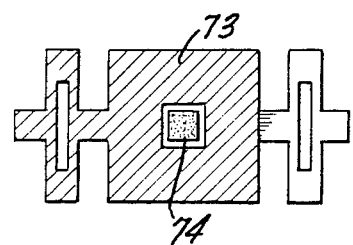
Figure 15:
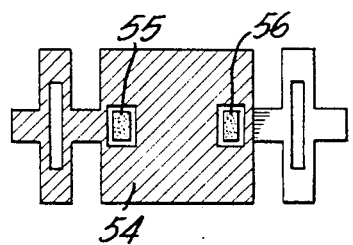
Figure 16:
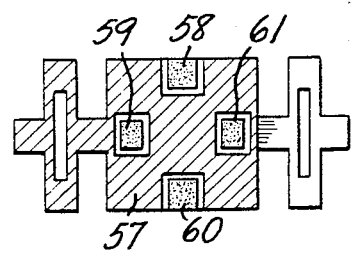
Figure 17:
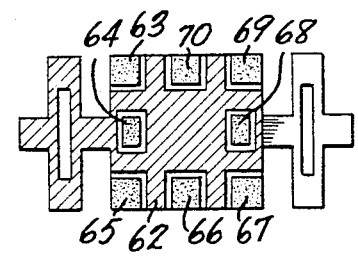
Figure 18:
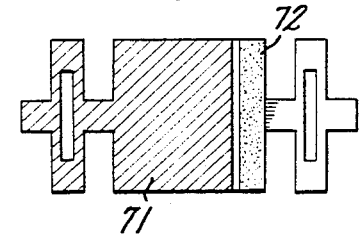

FIG. 15 shows a plan view of another embodiment of electrode arrangement of the coupling resonator according to the present invention. An exciting electrode 54 and masses 55 and 56 for frequency adjustment are deposited on the resonant portion. FIG. 16 shows a plan view of another embodiment of electrode arrangement of the coupling resonator according to the present invention. An exciting electrode 57 and masses 58, 59, 60 and 61 are deposited on the resonant portion. FIG. 17 shows a plan view of another embodiment of electrode arrangement of the coupling resonator according to the present invention. An exciting electrode 62 and masses 63–70 for frequency adjustment are deposited on the resonant portion. FIG. 18 shows a plan view of another embodiment of the resonator according to the present invention. An exciting electrode 71 and a mass 72 for frequency adjustment are deposited on the resonant portion. FIG. 19 shows a plan view of another embodiment of electrode arrangement of the coupling resonator according to the present invention. An exciting electrode 73 and a mass 74 for frequency adjustment are deposited on the resonant portion. Although not shown, rear exciting electrodes may be deposited on the overall rear surface of the resonant portion, or may be deposited symmetrically to the exciting electrodes and the masses for frequency adjustment, as illustrated in FIG. 10. Further, although plural masses are deposited on the resonant portion in FIGS. 10–17, it is to be noted that the same effect is obtained by depositing one mass though the amount of frequency adjustment is different.

Figure 20A:
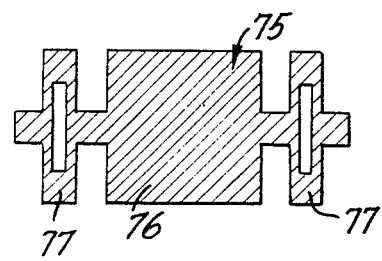
FIGS. 20(A) and 20(B) show another embodiment of electrode arrangement of the shape of the coupling resonator according to the present invention.
Figure 20B:
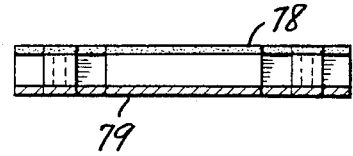

FIGS. 20(A) and 20(B) show a plan view and a side view of another embodiment of electrode arrangement of the coupling resonator according to the present invention. Exiting electrodes 78 and 79 are respectively deposited on the overall upper and lower opposed major surfaces of a resonant portion 76 and a supporting portion 77 of a quartz crystal resonator 75. By depositing the exciting electrodes on the resonant portion and the supporting portions, the efficiency of the electric field can be more improved and thus the IC value can be made smaller.

Figure 21:
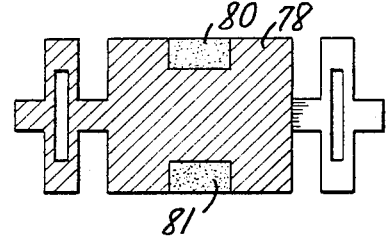
FIG. 21 shows a plan view of another embodiment of electrode arrangement and masses of the shape of the coupling resonator according to the present invention.

FIG. 21 show a plan view of another embodiment of electrode arrangement and masses on the coupling resonator according to the present invention. Exciting electrodes 78, 78' (not shown) are uniformly arranged on the overall upper surface and lower surface (not shown) of the resonant portion and respective ones of the supporting portions of the quartz crystal resonator, further masses 80 and 81 with electrode load effect are deposited on the electrode 78 at both sides of the resonant portion.

Figure 22:
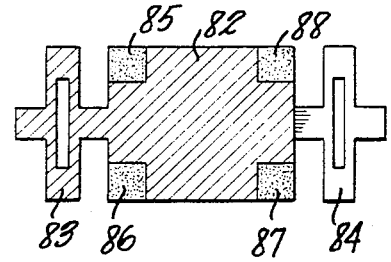
FIG. 22 shows a plan view of another embodiment the electrode arrangement and masses of the shape of the coupling resonator according to the present invention.

FIG. 22 shows a plan view of another embodiment of electrode arrangement and masses of the present invention. Exciting electrodes 82 and 82' (not shown) are uniformly deposited on the overall upper surface and lower surface (not shown) of the resonant portion and respective ones of the supporting portions 83 and 84 of the quartz crystal resonator in a similar manner to FIG. 21. Further, masses 85, 86, 87 and 88 with electrode load effect are deposited on four corners on the electrode 82 of the resonant portion.

The electrode load effects comprise the following three effects:

(1) The exciting electrode at the side of the resonant portion serves as a mass by increasing the thickness. Therefore the resonance frequency f and the temperature characteristics can be changed.

(2) Reflection of the elastic wave at the side of the resonant portion is reduced and the spurious vibration can be restricted by the electrode load effect.

(3) The exciting energy can be trapped inside the resonant portion. Therefore the CI value is further reduced.

Although FIGS. 21 and 22 show embodiments in which the masses with electrode load effect are deposited on the exciting electrode on the overall surface of the resonant portion, it is to be noted that the masses may be arranged on the exciting electrodes in FIGS. 12–18 without deteriorating the electrode load effect.

Subsequently, the manner in which the CI value varies in accordance the area of the resonant portion covered by the exciting electrodes will be illustrated.

Figure 23:
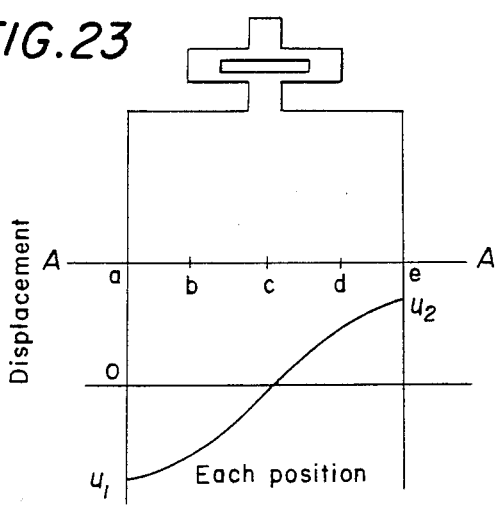
FIG. 23 shows a half view of the GT-cut quartz crystal resonator whose resonant portion and supporting portions are made in one piece.

FIG. 23 shows one half of the GT-cut quartz crystal resonator according to the present invention whose resonant portion and supporting portions are made in one piece. The calculated value of the relationship between displacement and each position of the section taken on line A—A is shown. The displacement is zero at point c, and the absolute value of the displacement becomes larger at both ends, i.e., the displacement is largest at point a and point e (displacement $u_1 = -u_2$).

Figure 24:
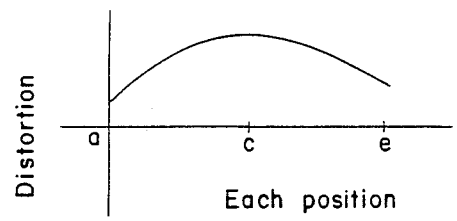
FIG. 24 shows the relationship between each of the positions of the resonator in FIG. 23 and the distorsion.

FIG. 24 shows the relationship between each of the positions and the distortion. The distortion is the largest at point c and becomes smaller at the end portions. As understood by FIG. 24, the distortion is not zero at points a and e. This means that the CI value of the quartz crystal resonator is different in case the exciting electrode is arranged at the ends of the resonant portion as compared to the case in which the exciting electrode is not arranged at the ends of the resonant portion. Namely the low CI value is obtained when the exciting electrode is also arranged at the end of the resonant portion.

Figure 25A:
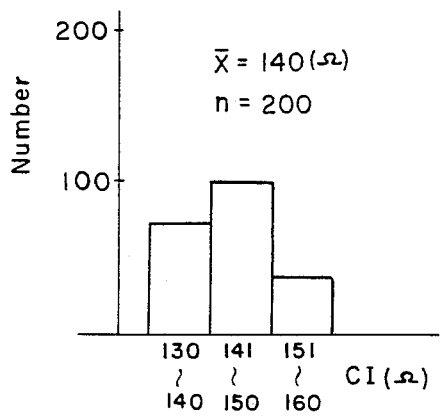
FIG. 25(A) shows the histogram showing the distribution of the CI value.
Figure 25B:
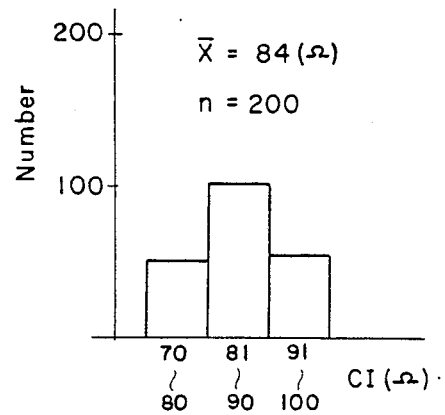
FIG. 25(B) shows another histogram showing the distribution of the CI value.

FIG. 25 is a histogram showing the distribution of the experimentally obtained CI value in the case where the exciting electrodes are arranged on the overall upper and lower surfaces of the resonant portion as in FIGS. 8(A) and 8(B) and in the case where the exciting electrodes are arranged on some part of the resonant portion (about 75% of the resonant portion) as in FIGS. 9(A) and 9(B). FIG. 25(A) is the histogram showing the distribution of the CI value against the number n=200 when the exciting electrodes are arranged on some part of the resonant portion. The average CI value $\overline{X}=140$ ($\Omega$). FIG. 25(B) is the histogram showing the distribution of the CI value against the number n=200 when the exciting electrodes are arranged on the overall upper and lower surfaces of the resonant portion. The average CI value $\overline{X}=84$ ($\Omega$). It shows that the CI value is reduced by about 40% when the exciting electrodes are arranged on the overall upper and lower surfaces of the resonant portion. The resonance frequency and the frequency-temperature characteristics are adjusted by laser when the exciting electrodes and the masses are separately provided as in FIGS. 10–19. On the other hand, the resonance frequency and the frequency-temperature characteristics are adjusted by evaporation when the exciting electrodes are provided on the overall surfaces of the resonant portion and the masses are deposited thereon as in FIGS. 21 and 22.

Now an embodiment of adjusting the frequency-temperature coefficient and the resonance frequency by the addition or reduction of the masses will be illustrated in detail.

Figure 26:
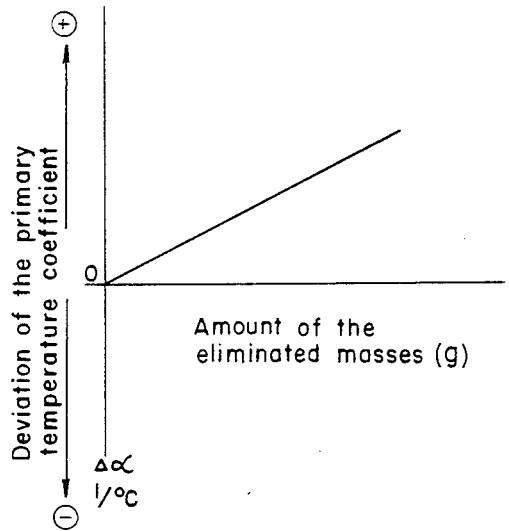
FIG. 26 shows the relationship between the amount of the eliminated masses and the deviation $\Delta\alpha$ of the primary temperature coefficient $\alpha$.

FIG. 26 shows the relationship between the amount of the eliminated masses 25 and 26 in FIG. 10 scattered by laser and the deviation $\Delta\alpha$ of the primary temperature coefficient $\alpha$. The primary temperature coefficient $\alpha$ shifts to the positive side and increases in a positive sense with an increase in the amount of the eliminated masses.

Figure 27:
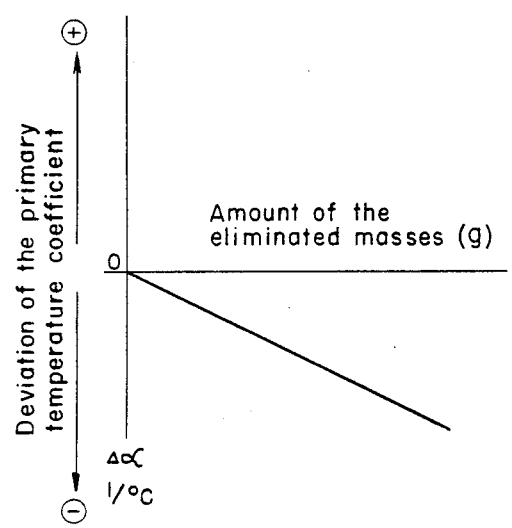
FIG. 27 shows another relationship between the amount of the eliminated masses and the deviation $\Delta\alpha$ of the primary temperature coefficient $\alpha$.

FIG. 27 shows the relationship between the amount of the eliminated masses 30, 31, 32 and 33 in FIG. 11 scattered by laser and the deviation $\Delta\alpha$ of the primary temperature coefficient $\alpha$. The primary temperature coefficient $\alpha$ shifts to the negative side and increases in a negative sense with an increase in the amount of the eliminated masses. It is found from FIGS. 26 and 27 that the primary temperature coefficient $\alpha$ shifts to the positive side by eliminating the masses in case of the arrangement of the masses in FIG. 10, while the primary temperature coefficient $\alpha$ shifts to the negative side by eliminating the masses in case of the arrangement of the masses in FIG. 11. It has been found that the primary temperature coefficient $\alpha$ does not deviate when a mass is arranged at positions between the masses 25 and 26 in FIG. 10 and the masses 30, 31, 32, and 33 in FIG. 11. FIG. 12 shows such an arrangement of the masses.

FIG. 28 shows the relationship between the amount of the masses 36, 37, 38 and 39 in FIG. 12 eliminated by laser and the deviation $\Delta\alpha$ of the primary temperature coefficient $\alpha$. It has been found that the primary temperature characteristic $\alpha$ does not vary by eliminating the masses.

FIG. 29 shows the relationship between the amount of the masses 25 and 26 in FIG. 10, the masses 30, 31, 32 and 33 in FIG. 11, and the masses 36, 37, 38 and 39 in FIG. 12 eliminated by laser and the variation of the resonance frequency of the main vibration. Straight lines D, E and F correspond respectively to the relationship between the amount of the eliminated masses and the variation of the main resonance frequency in case of FIG. 10, FIG. 12 and FIG. 11. It is understood that the resonance frequency of the main vibration becomes higher as the amount of the eliminated masses increases. Although the frequency adjustments by reduction of the masses have been illustrated in the present embodiments, it is to be noted that the above-noted phenomenon is completely reversed when the masses are added. Further, although the explanation has been made with respect to FIGS. 10, 11 and 12, the resonance frequency and the frequency-temperature characteristics, or only the resonance frequency, can be changed by adjustment of the masses shown in FIGS. 13-19.

Figure 30A:
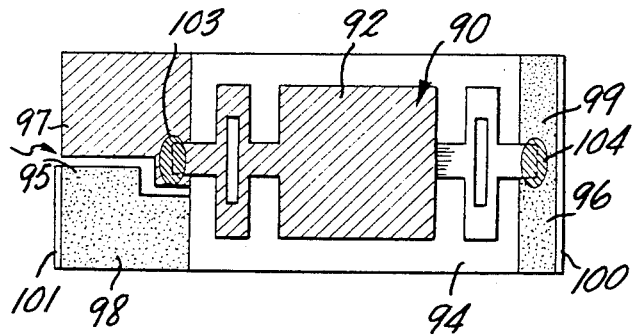
FIGS. 30(A), 30(B) and 30(C) show an embodiment of the GI-cut quartz resonator mounted on a pedestal according to the present invention.
Figure 30B:
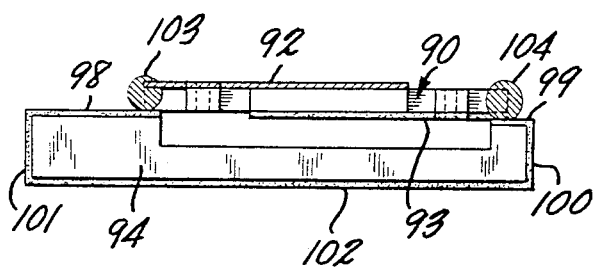
Figure 30C:
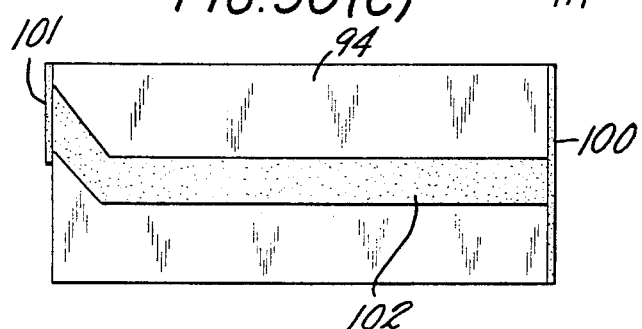

FIGS. 30(A), 30(B) and 30(C) show an embodiment of a GT-cut quartz resonator 90 mounted on a pedestal 94 according to the present invention. FIG. 30(A) shows a top plan view, FIG. 30(B) shows a lower said view of FIG. 30(A) and FIG. 30(C) shows a bottom view of FIG. 30(B). The pedestal 94 has a recessed center portion bounded at opposite ends by pedestal end portions 95 and 96 and electrodes 97, 98 and 99 are arranged on both of the end portions 95 and 96 in the manner shown. The electrodes 98 and 99 are connected through side electrodes 100, 101 and an electrode 102 arranged on the lower surface of the pedestal 94.

A quartz resonator 90 is supported on both end portions 95 and 96 of the pedestal 94 with the above electrode arrangement and secured with adhesives or solders 103 and 104 at the end of the resonator. By this arrangement, an exciting electrode 92 is connected to the electrode 97, and an exciting electrode 93 is connected to the electrode 99 so that the exciting electrode 93 has the same polarity as the electrode 98 through the electrodes 100, 102 and 101. Namely, by the above electrode arrangement at two-terminal structure of the electrodes 97 and 98 is made. The electrodes 100, 101 and 102 are not drawn to scale but have been drawn thicker for easy understanding of the drawing. Thus the resonator with excellent shock resistance is attained by mounting the resonator on the pedestal.

Although the electrode 102 is arranged on the lower surface of the pedestal, it may be arranged inside the pedestal.

Figure 31A:
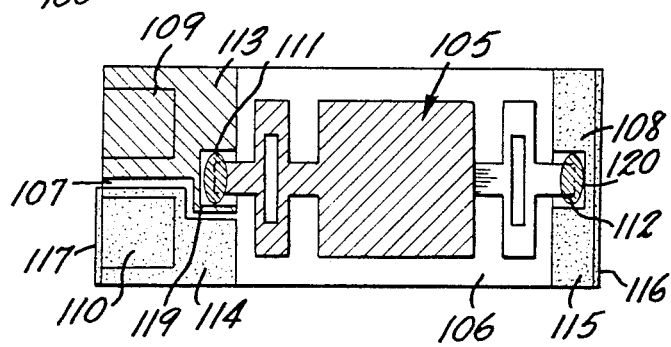
FIG. 31(A) shows a top plan view.
Figure 31B:
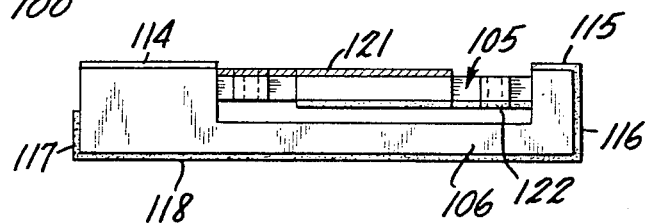
FIG. 31(B) shows a lower side view of FIG. 31(A) and FIG. 31(C) shows a bottom view of FIG. 31(B)
Figure 31C:
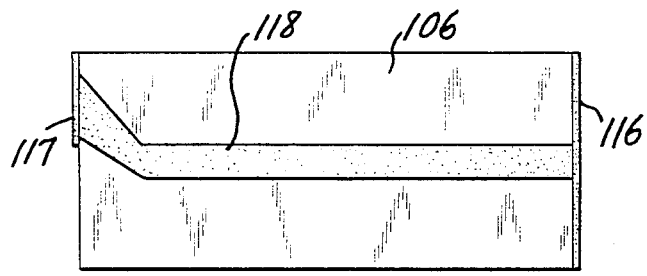

FIGS. 31(A), 31(B) and 31(C) show another embodiment of a GT-cut quartz resonator 105 mounted on a pedestal 106 according to the present invention. FIG. 31(A) shows a top plan view, FIG. 31(B) shows a lower side view of FIG. 3(A) and FIG. 31(C) shows a bottom view of FIG. 31(B). The pedestal 101 has a generally concave shape with a recessed center portion and opposite end portions 107 and 108. Recesses 109, 110, 111 and 112 are provided at both end portions 107 and 108, and electrodes 113, 114 and 115 are arranged on both of the end portions in the manner shown. The electrodes 114 and 115 are connected through side electrodes 116, 117 and bottom electrode 118 arranged on the lower surface of the pedestal 116. A quartz resonator 105 is mounted in the recesses 111 and 112 of the pedestal 106 and secured with adhesives or solders 119 and 120 at the end of the resonator. By the above arrangement, an exciting electrode 121 is connected to the electrode 113 and an exciting electrode 122 is connected to the electrode 115. The exciting electrodes 121 and 122 are of the same polarity as the electrode terminals 113 and 114. Thus the resonator mounted in the recesses not only has excellent shock resistance but also is easily set and improved in workability. The pedestal on which the resonator is mounted is then mounted on lead wires, and thereafter sealed in now vacuum or a housing which is under filled with $N_2$.

The effect of the thickness of the resonator will now be described.

In manufacturing resonators, the spurious vibration is generally a main factor which deteriorates the yield of the resonators. In this invention, the spurious vibration may be generated at frequencies near the main vibration frequency due to the plate thickness. Accordingly, the plate thickness is selected between $50\mu$ and $100\mu$ to eliminate the spurious vibration. The lower limit value of $50\mu$ is selected because it is the minimum thickness in mass production and the plate of $50\mu$ thickness can be easily handled. The upper limit value of $100\mu$ is selected to enable processing of the resonator by photolithographic etching because the resonator cannot be processed mechanically because of its complicated shape. The thickness of the resonator is selected from the range of $50\mu$–$100\mu$ according to the frequency. The higher the resonance frequency is, i.e., the smaller the width W of the resonator is, the smaller the thickness of the plate is.

FIG. 32 shows a curve of the temperature characteristic according to the present invention. It is understood from FIG. 32 that an excellent temperature characteristic is obtained.

A method for manufacturing a resonator unit will now be described in detail.

FIGS. 33(A) and 33(B) shown an embodiment of the shape and electrode arrangement of a GT-cut coupling resonator according to the present invention, in which a resonant portion 124 is made in one piece with two supporting portions 125 at both sides of the resonant portion. FIG. 33(A) is a plan view and FIG. 33(B) is a side view. Exiting electrodes 128 and 129 are respectively provided uniformly on the overall lower and upper surfaces 126 and 127 of the resonant portion 124 of a quartz crystal 123. The exciting electrode 128 elongates to one supporting portion 125 and the exciting electrode 129 elongates to the other. Each exciting electrode is formed on only one surface of the supporting portion and this no electric field is applied between opposed faces of the two supporting portions. Accordingly the energy of the resonant portion is sealed in the interior of the resonant portion as much as possible lest it should be transferred to the supporting portion as discussed hereinbefore.

FIG. 34 shows an example of the temperature characteristic of the GT-cut quartz crystal resonator formed by photolithography, in which the temperature characteristics differ according to the coupling strength. Line a indicates a strong coupling between the main vibration and the spurious vibration, and line b indicates a weak coupling between the two. The primary temperature coefficient $\alpha$ disperses between $2.5 \times 10^{-6}/°C$. and $1.0 \times 10^{-6}/°C$., and consequently an excellent temperature characteristic cannot be obtained. Ordinary resonators have such temperature characteristics.

FIG. 35 shows the relationship between the side ratio $R = W/L$ and the primary temperature coefficient $\alpha$ of the GI-cut quartz crystal resonator according to the present invention, in which the resonance portion and the supporting portions are made in one piece. The primary temperature coefficient $\alpha$ becomes larger with an increase in the side ratio R. The primary temperature coefficient $\alpha$ changes by about 1.3 ppm/°C. when the side ratio R changes by 0.01.

Figure 36:
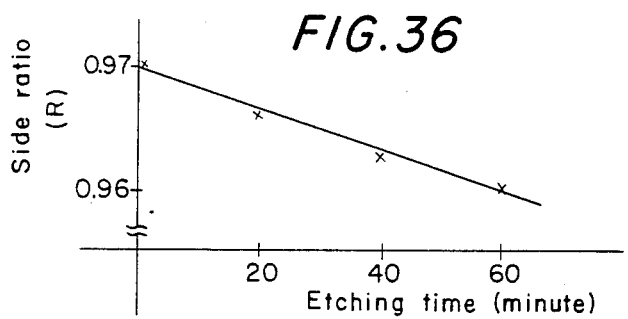
FIG. 36 is a graph showing the relationship between the etching time and the side ratio R of the GT-cut quartz crystal resonator according to the present invention.

FIG. 36 shows the relationship between the etching time and the side ratio R of the GT-cut quartz crystal resonator according to the present invention. The side ratio R becomes gradually smaller with increase in the etching time. Experimentation has shown that the side ratio R decreases by about 0.01 after 60 min. etching.

Figure 37:
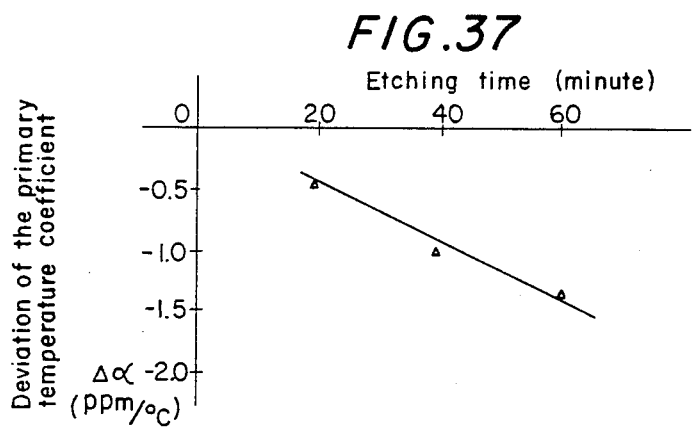
FIG. 37 is a graph showing the relationship between the etching time and the deviation $\Delta\alpha$ of the primary temperature coefficient $\alpha$ of the GT-cut quartz crystal resonator according to the present invention.

FIG. 37 shows the relationship between the etching time and the deviation Δα in the primary temperature coefficient α of the GT-cut quartz crystal resonator according to the present invention. The deviation of the primary temperature coefficient Δα after 20 min. etching is about −0.5 ppm/°C. Δα becomes smaller with an increase in the etching time, and Δα is −1.3 ppm/°C. after 60 min. etching.

Now, a method of adjusting the frequency-temperature coefficient will be described.

The GT-cut quartz crystal resonator shown in FIGS. 33(A) and 33(B) formed by photolithography is designed to have the following features:

(1) The primary temperature coefficient α has a positive value. More specifically, the primary temperature coefficient α should be in the range of between +2.5 ppm/°C. and +1.0 ppm/°C.

(2) The resonance frequency of the main vibration has a higher value than the reference frequency $f_0$ to be tuned in, normally by 500–1000 ppm.

This type of resonator can be easily obtained by selecting the shape and etching time. The resonator formed by etching is brought to an arbitrary temperature $t_1$. The temperature $t_1$ is read by a thermometer such as a thermistor, and the resonance frequency $f_1$ of the main vibration is also measured. Then, the resonator is brought to another arbitrary temperature $t_2$, and the resonance frequency $f_2$ of the main vibration is also measured in the similar manner. The primary temperature coefficient α is obtained by the following formula using $t_1$, $t_2$ and $f_1$, $f_2$.

$$\alpha = \frac{f_2 - f_1}{t_2 - t_1} \text{ (Hz/°C.)} \quad (1)$$

The formula can be rewritten as follows by use of the reference frequency $f_0$ to be tuned in.

$$\alpha = \frac{f_1 - f_2}{f_0} \cdot \frac{1}{t_2 - t_1} \text{ (1/°C.)} \quad (2)$$

α is found by formulae (1) and (2). Namely the temperature coefficient after etching of the external shape of the resonator is experimentally found.

Figure 38:
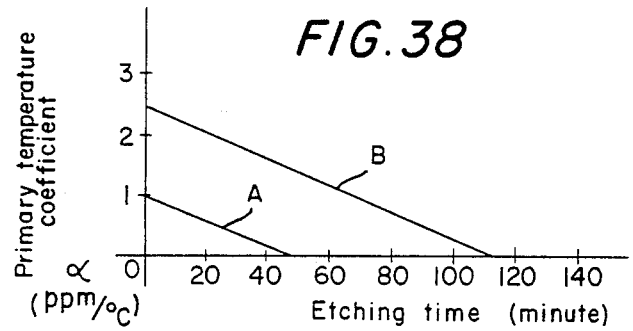
FIG. 38 is a graph showing the relationship between the primary temperature coefficient $\alpha$ and the etching time to make $\alpha$ zero in case $\alpha=1$ ppm/°C. and 2.5 ppm/°C. after etching the GT-cut quartz crystal resonator according to the present invention.

FIG. 38 shows the relationship between the primary temperature coefficient α and the external shape etching time needed to make α zero of the GT-cut quartz crystal resonator according to the present invention, in case of line A whose α is 1 ppm/°C. and line B whose α is 2.5 ppm/°C.

When α is 1 ppm/°C., α is made zero after 45 min. etching. When α is 2.5 ppm/°C. α is made zero after 115 min. etching. Thus the primary temperature coefficient α is found by temperatures $t_1$ and $t_2$ and the resonance frequencies $f_1$ and $f_2$. Since the etching time has a linear relationship with respect to α, the primary temperature coefficient α can be made near zero by controlling the etching times for each α. The secondary and tertiary temperature coefficients of the GT-cut quartz resonator according to the present invention are negligible since they are considerably small in comparison with the primary temperature coefficient α.

Figure 39:
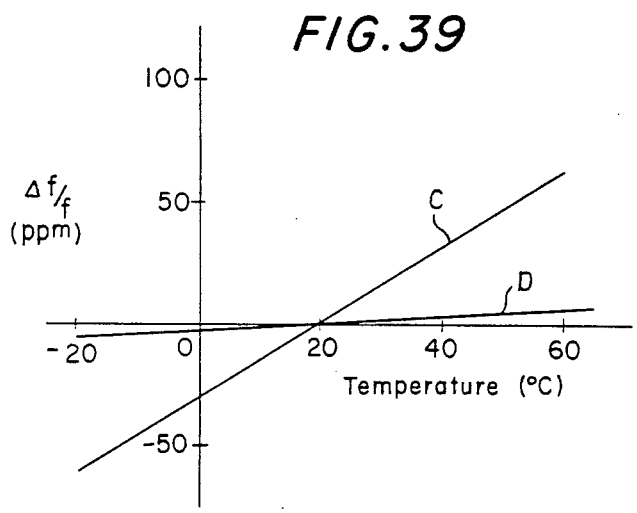
FIG. 39 is a graph showing an embodiment of the temperature characteristics after adjusting the temperature coefficient by the method of the present invention.

FIG. 39 shows a graph of the temperature characteristic whose temperature coefficient α is adjusted by the method of the present invention. A straight line C is the temperature characteristic after etching the external shape, in which the primary temperature coefficient α is as large as about 1.5 ppm/°C. and the temperature characteristic is unsatisfactory. On the contrary, a straight line D is the temperature characteristic after 70 min. etching, in which the primary temperature coefficient α is considerably small, such as about 0.1 ppm/°C., and an excellent temperature characteristic is obtained. Although the temperature characteristic of the straight line D obtained in FIG. 39 is excellent, the resonance frequency of the main vibration should be regulated since it deviates from the reference frequency $f_0$ by 3000–5000 ppm. The resonator is mounted on a pedestal after etching the external shape thereof.

FIGS. 40(A), 40(B) and 40(C) show an embodiment of a GT-cut quartz crystal resonator 132 mounted on a pedestal 136 according to the present invention. FIG. 40(A) is a top plan view, FIG. 40(B) is a lower side view of FIG. 40(A), and FIG. 40(C) is a bottom view of FIG. 40(B). The pedestal 136 has a generally concave shape and has a recessed center portion and two spaced-apart end portions 137,138 and electrodes 139, 140 and 141 are arranged on the end portions 137 and 138. The electrode 140 is connected to the electrode 141 via side electrodes 142, 143 and a bottom electrode 144 arranged on the lower surface of the pedestal 136. A quartz crystal resonator 132 is mounted and supported on both end portions 137, 138 of the pedestal 136 with the above electrode arrangement, and secured at the ends thereof by adhesives or solders 145, 146. By such a construction, an exciting electrode 134 is connected to the electrode 139, and an exciting electrode 135 is connected to the electrode 141 so that the exciting electrode 135 is of the same polarity as the electrode 140 via the electrodes 142, 144 and 143. The above electrode arrangement on the pedestal 136 constitutes a two-terminal structure of the electrodes 139 and 140. The electrodes 142, 143 and 144 are drawn thicker than a scale to be easily understood. Such a resonator mounted on a pedestal has an excellent shock resistance.

FIGS. 41(A), 41(B) and 41(C) show another embodiment of the invention, in which a GT-cut quartz crystal resonator 147 is mounted on a pedestal 148 according to the present invention. FIG. 41(A) is a top plan view, FIG. 41(B) is a lower side view of FIG. 41(A), and FIG. 41(C) is a bottom view of FIG. 41(B). The pedestal 148 has a generally concave shape and has a recessed center portion with two spaced-apart end portions 149,150, and recesses 151, 152, 153 and 154 are provided at both end portions 149, 150 on which electrodes 155, 156 and 157 are arranged. The electrode 156 is connected to the electrode 157 via side electrodes 158, 159 and a bottom electrode 160 arranged on a lower surface of the pedestal 148. A quartz crystal resonator 147 is mounted and supported in the recesses 153, 154 of the pedestal 148 with the above electrode arrangement, and secured by adhesives or solder 161, 162 at the end thereof. By such a construction, an exciting electrode 163 is connected to the electrode 155 and an exciting electrode 164 is connected to the electrode 156. The exciting electrode 164 is at the same polarity as the electrode 156 through electrodes 158, 160 and 159. By mounting the resonator in the recesses, a resonator with excellent shock resistance is obtained. Further the resonator is easily set and its workability is improved.

The pedestal, on which the resonator is mounted, is then mounted on the lead wires.

Figure 42:
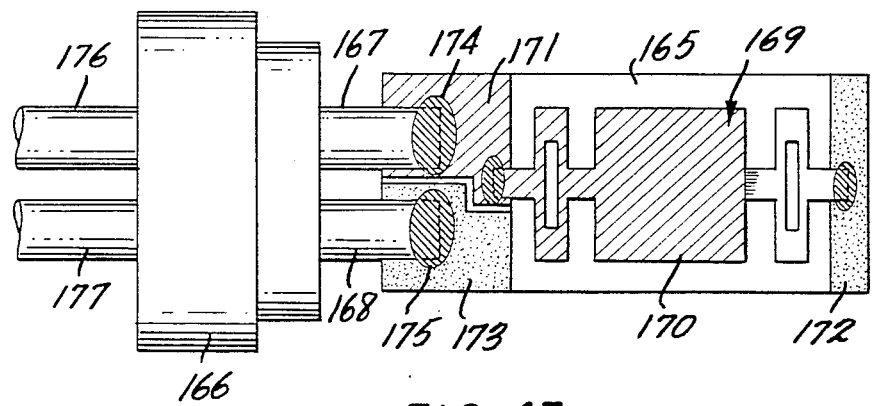
FIG. 42 is a plan view of an embodiment of the present invention, wherein the pedestal shown in FIGS. 40(A), 40(B) and 40(C) is mounted on the support lead wires provided on the stem.

FIG. 42 is a plan view of an embodiment of the invention, in which a pedestal 165 similar to that shown in FIGS. 40(A), 40(B) and 40(C) is mounted on support lead wires 167 and 168 provided on a stem 166. An exciting electrode 170 disposed on a quartz crystal resonator 169 is connected to an electrode 171 on the pedestal 165, while a rear exciting electrode (not shown) is connected to an electrode 172 and further connected to an electrode 173 through a lower electrode (not shown). The terminal electrodes 171 and 173 are secured to the support lead wires 167 and 168 with adhesives or solders 174 and 175 to form two terminals 176 and 177.

Figure 43:
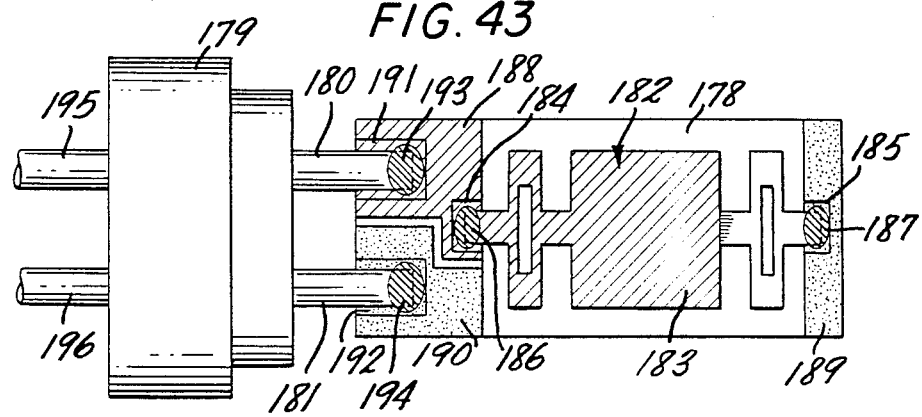
FIG. 43 is a plan view of another embodiment of the present invention, wherein the pedestal shown in FIGS. 41(A), 41(B) and 41(C) is mounted on the support lead wires provided on the stem.

FIG. 43 is a plan view of another embodiment of the invention, in which a pedestal 178 similar to that shown in FIGS. 41(A), 41(B) and 41(C) is mounted on support lead wires 180 and 181 provided on a stem 179. A quartz crystal resonator 182 is arranged in recesses 184 and 185 provided on the pedestal 178 and secured by adhesives or solders 186 and 187. An exciting electrode 183 of the quartz crystal resonator 182 is connected to an electrode 188 and a rear exciting electrode (not shown) is connected to an electrode 189, and further connected to an electrode 190 through side and lower electrodes (not shown). The support lead wires 180, 181 provided on the stem 179 are arranged in recesses 191 and 192 formed in the pedestal 178 and secured with adhesives or solders 193 and 194, and connected to the electrodes 188 and 190 to define two terminals 195 and 196. As shown, the pedestal recesses 184,185 and 191,192 are covered at least in part by the respective exciting electrodes 188,190. The pedestal is made of insulating materials such as ceramics or quartz crystal, and the electrodes are made of gold or silver. The two-terminal structure is constructed when the quartz crystal resonator is mounted on the pedestal by arranging the electrode structure on the pedestal whereby the support lead wires can be easily mounted and the workability is improved.

Next, a method used to tune the resonance frequency of the main vibration to the reference frequency $f_0$ will be described.

Figure 44:
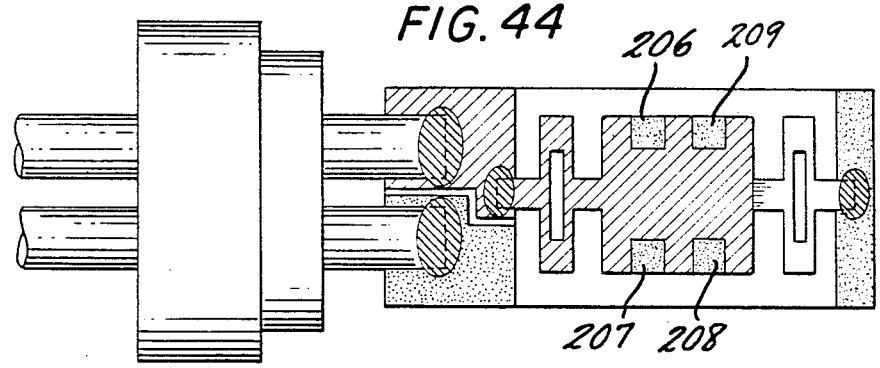
FIG. 44 is a plan view showing an embodiment wherein the masses are deposited on the GT-cut quartz crystal resonator by evaporation.
Figure 45:
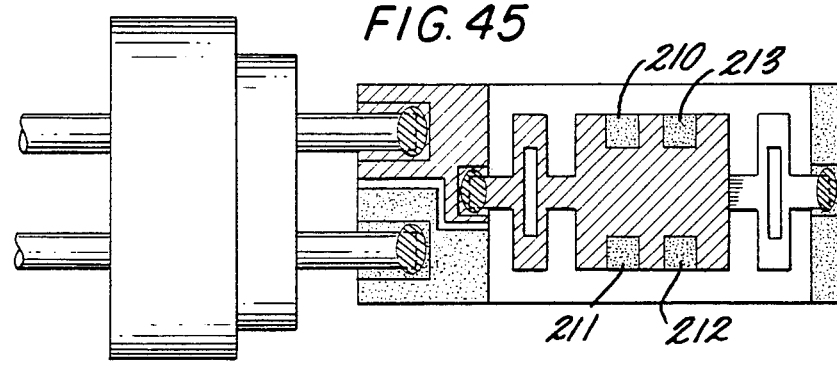
FIG. 45 is a plan view showing another embodiment wherein the masses are deposited on the GT-cut quartz crystal resonator by evaporation.
Figure 46:
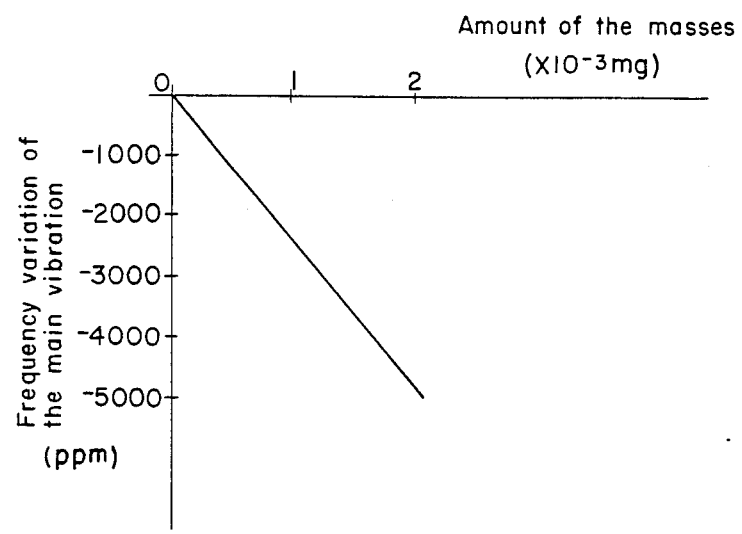
FIG. 46 is a graph showing the relationship between the amount of the masses and the deviation of the resonance frequency of the main vibration.
Figure 47:
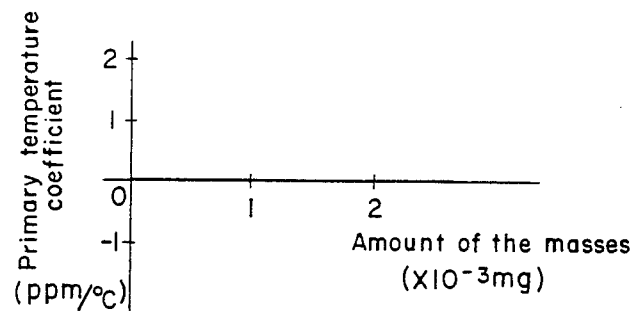
FIG. 47 is a graph showing the relationship between the amount of the masses and the primary temperature coefficient $\alpha$.
Figure 48:
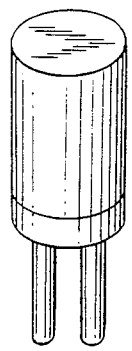
FIG. 48 is a perspective view showing external appearance of an embodiment of the coupling resonator unit obtained by the manufacturing method of the present invention.

FIG. 44 shows as embodiment in which masses 206, 207, 208 and 209 are deposited on the GT-cut quartz crystal resonator in FIG. 42 by evaporation. FIG. 45 shows another embodiment in which masses 210, 211, 212 and 213 are deposited on the GT-cut quartz crystal resonator in FIG. 43 by evaporation. FIG. 46 shows the relationship between the amount of the masses and the variation of the resonance frequency of the main vibration. It is understood that the resonance frequency of the main vibration becomes lower in accordance with an increase in the amount of the masses, and the resonance frequency of the main vibration can be tuned to the reference frequency $f_0$ even if the former deviates from the latter by 5000 ppm. FIG. 47 shows the relationship between the masses 206, 207, 208 and 209 in FIG. 44 and the masses 210, 211, 212 and 213 in FIG. 45 deposited on the resonator and the primary temperature coefficient $\alpha$. No deviation $\alpha$ is found due to the presence of the masses. Namely, it is found that the resonance frequency of the main vibration can be tuned to the reference frequency $f_0$ without varying the temperature characteristics. Then the quartz crystal resonators in FIGS. 44 and 45 are sealed in a housing in vacuum or in $N_2$. The sealing in vacuum is suitable in case the electrical property of the resonator has priority; while the sealing in $N_2$ is suitable in case the workability has priority. FIG. 48 shows a perspective view of a coupling resonator unit obtained by the manufacturing method according to the present invention.

As illustrated, a coupling quartz crystal resonator with excellent frequency-temperature characteristics, small CI value, excellent shock resistance and easy mounting process is provided by molding the resonant portion and the supporting portions of the resonator in one piece by photolithography; improving the structure of the supporting portions; selecting the optimum side ratio; arranging the exciting electrodes on the overall or partial surfaces of the resonant portion of the resonator; depositing masses for adjusting the resonance frequency and the frequency-temperature characteristics on the resonant portion; and mounting the resonator on the pedestal. Accordingly the coupling quartz crystal resonator according to the present invention is suitable for use in various consumer products.

Further, the manufacturing method of the coupling resonator unit according to the present invention comprises the steps of: molding the external shape of the resonator by etching; mounting the resonator on the pedestal; mounting the pedestal on the lead wires; tuning the resonance frequency of the resonator to the reference frequency; and sealing the resonator. The present invention provides a coupling resonator unit with excellent temperature characteristics in which the resonance frequency of the main vibration is tuned to the reference frequency. Since the quartz crystal resonator is mounted on the pedestal, the resonator unit with improved workability and excellent shock resistance is provided. Further, the terminal electrodes are arranged on one side of the pedestal according to the present invention (two-terminal structure), the lead wires are easily mounted and the workability is improved.

What I claim is:

1. A coupling quartz crystal resonator unit comprising: a resonator including a resonant portion having opposed relatively short sides and opposed relatively long sides and being provided with a pair of exciting electrodes on its surface, and a pair of supporting portions connected to respective ones of said short sides and each having a mount portion; a pedestal supporting and fixing said mount portions of the resonator; a pair of electrode terminals disposed on the same side of the pedestal and connected to respective ones of said pair of exciting electrodes; a stem; and two lead wires passing through the stem and having ends electrically and mechanically secured to said pair of electrode terminals of the pedestal; said pedestal having rececesses which are covered at least in part by respective ones of the pair of electrode terminals and in which are disposed at least either said mount portions of the resonator or said ends of the lead wires.

2. A coupling quartz crystal resonator unit as claimed in claim 1; wherein said resonator comprises a GT-cut quartz crystal resonator.

3. A coupling quartz crystal resonator unit as claimed in claim 1; wherein one of said exciting electrodes is provided on the upper major surface of the resonant portion and the other is provided on the lower major surface.

4. A coupling quartz crystal resonator unit as claimed in claim 1; wherein one of said exciting electrodes on the resonant portion is electrically connected to one of said electrode terminals through one of said mount portions and the other of said exciting electrodes is electrically connected to the other of said electrode terminals through the other of said mount portions.

5. A coupling quartz crystal resonator unit as claimed in claim 4; wherein the pedestal has on its bottom surface an electrode for electrically connecting the exciting electrode which is connected through the resonator mount portion remote from the lead wires to its corresponding electrode terminal.

6. A coupling quartz crystal resonator unit as claimed in claim 1; wherein said mount portions of the resonator are mounted in the recesses in the pedestal.

7. A coupling quartz crystal resonator unit as claimed in claim 6; wherein the ends of the two lead wires are disposed in the recesses on one side of the pedestal.

8. A coupling quartz crystal resonator unit as claimed in claim 1; wherein the ends of the two lead wires are disposed in the recesses on one side of the pedestal.

9. A coupling resonator unit comprising: a coupling resonator comprised of a single piece of piezoelectric material having a resonant portion defined by a pair of opposed major surfaces and opposed relatively short sides and opposed relatively long sides, a pair of supporting portions each connected to one of the resonant portion short sides and each terminating in a mount portion, and a pair of exciting electrodes disposed on respective ones of the resonant portion major surfaces for exciting the resonant portion into vibration during use of the coupling resonator unit; an elongate pedestal having first and second spaced apart end portions and a recessed portion located between the first and second end portions, the coupling resonator mount portions being mounted on and supported by the pedestal end portions with the coupling resonator resonant portion overlying and spaced from the pedestal recessed portion thereby enabling the coupling resonator to undergo vibration while supported by the pedestal, said pedestal first end portion having a pair of recesses; a pair of electrode terminals disposed in side-by-side relation on the pedestal first end portion, said electrode terminals extending into and covering at least part of respective ones of the pair of pedestal recesses; means on the pedestal for electrically connecting the pair of exciting electrodes to respective ones of the pair of electrode terminals; a stem; and a pair of lead conductors extending completely through the stem and having ends extending into respective ones of the pair of pedestal recesses, the lead conductor ends being electrically and mechanically connected to respective ones of the pair of electrode terminals within the respective pedestal recesses.

10. A coupling quartz crystal resonator unit as claimed in claim 9; wherein the means on the pedestal for electrically connecting the pair of exciting electrodes includes an electrode path extending from one of the exciting electrodes along the pedestal second end portion and along the underside of the pedestal and along the pedestal first end portion to one of the pair of electrode terminals.

11. A coupling quartz crystal resonator unit as claimed in claim 6; wherein the electrode path comprises a top electrode disposed on the top surface of the pedestal second end portion and being electrically connected to the said one exciting electrode, a side electrode disposed along the outer side of the pedestal second end portion and being electrically connected to the top electrode, a bottom electrode disposed lengthwise along the bottom underside of the pedestal and being electrically connected to the side electrode, and another side electrode extending along the outer side of the pedestal first end portion and being electrically connected at one end to the bottom electrode and being electrically connected at its other end to the said one electrode terminal.

12. A coupling quartz crystal resonator unit as claimed in claim 9; wherein the pedestal first and second end portions each have a recess in which is disposed respective ones of the coupling resonator mount portions.

13. A coupling quartz crystal resonator unit as claimed in claim 12; wherein the means on the pedestal for electrically connecting the pair of exciting electrodes includes an electrode path extending from one of the exciting electrodes along the pedestal second end portion and along the underside of the pedestal and along the pedestal first end portion to one of the pair of electrode terminals.

14. A coupling quartz crystal resonator unit as claimed in claim 13; wherein the electrode path comprises a top electrode disposed on the top surface of the pedestal second end portion and being electrically connected to the said one exciting electrode, a side electrode disposed along the outer side of the pedestal second end portion and being electrically connected to the top electrode, a bottom electrode disposed lengthwise along the bottom underside of the pedestal and being electrically connected to the side electrode, and another side electrode extending along the outer side of the pedestal first end portion and being electrically connected at one end to the bottom electrode and being electrically connected at its other end to the said one electrode terminal.

15. A coupling quartz crystal resonator unit as claimed in claim 9; wherein the pair of pedestal recesses each has an open end which opens at the peripheral edge of the pedestal at a location facing the stem and a closed end which is opposite the open end and which terminates within the pedestal first end portion.

16. A coupling quartz crystal resonator unit as claimed in claim 15; wherein the pedestal has opposed top and bottom sides, the pedestal recessed portion and the pair of pedestal recesses being formed at the pedestal top side.

17. A coupling quartz crystal resonator unit as claimed in claim 12; wherein the recesses in which are disposed the coupling resonator mount portions have a deep enough extent to ensure that the coupling resonator does not extend above the level of the pedestal first and second end portions.

* * * * *